US011145802B2

(12) United States Patent
Lazar et al.

(10) Patent No.: US 11,145,802 B2
(45) Date of Patent: Oct. 12, 2021

(54) MULTIPLE STEP EDGE FABRICATION

(71) Applicant: Commonwealth Scientific and Industrial Research Organisation, Acton (AU)

(72) Inventors: Jeina Lazar, Acton (AU); Wendy Purches, Acton (AU); Emma Mitchell, Acton (AU); Chris Lewis, Acton (AU)

(73) Assignee: Commonwealth Scientific and Industrial Research Organisation, Acton (AU)

( * ) Notice: Subject to any disclaimer, the term of this patent is extended or adjusted under 35 U.S.C. 154(b) by 0 days.

(21) Appl. No.: 17/262,981

(22) PCT Filed: Oct. 18, 2019

(86) PCT No.: PCT/AU2019/051139
§ 371 (c)(1),
(2) Date: Jan. 25, 2021

(87) PCT Pub. No.: WO2020/077416
PCT Pub. Date: Apr. 23, 2020

(65) Prior Publication Data
US 2021/0242391 A1 Aug. 5, 2021

(30) Foreign Application Priority Data

Oct. 19, 2018 (AU) .................. 2018903963

(51) Int. Cl.
*H01L 39/24* (2006.01)
*H01L 39/22* (2006.01)
(Continued)

(52) U.S. Cl.
CPC ...... *H01L 39/2493* (2013.01); *G01R 33/0354* (2013.01); *H01L 27/18* (2013.01); *H01L 39/223* (2013.01); *H01L 39/249* (2013.01)

(58) Field of Classification Search
CPC .............. H01L 39/2493; H01L 39/223; G01R 33/0354
See application file for complete search history.

(56) References Cited

U.S. PATENT DOCUMENTS 4,430,790 A * 2/1984 Ohta ..................... H01L 39/223
438/2
4,719,498 A 1/1988 Wada et al.
(Continued)

FOREIGN PATENT DOCUMENTS

JP 2018-125358 A 8/2018
WO WO 2017/109040 A1 6/2017

OTHER PUBLICATIONS

International Search Report for corresponding International Application No. PCT/AU2019/051139, dated Dec. 2, 2019, 6p.
(Continued)

*Primary Examiner* — Matthew L Reames
(74) *Attorney, Agent, or Firm* — Crowell & Moring LLP

(57) ABSTRACT

This disclosure relates to fabrication of step edges to fabricate Josephson junctions. A method comprises forming a layer of resist over the surface. The layer of resist comprises openings to expose a selected area of the surface, thereby forming two walls in the layer of resist on a perimeter of the selected area. The resist and the substrate are exposed to an ion beam, thereby etching the resist and the exposed areas of the surface. While exposing the resist and the substrate to the ion beam, the substrate is gradually rotated about an axis normal to the surface to thereby form two step edges at the respective two walls. Further, superconducting material is deposited onto the substrate in a meandering shape to form a path that crosses the two step edges multiple times and to form a Josephson junction each time the path crosses the step edges.

22 Claims, 10 Drawing Sheets

(51) Int. Cl.
　　　*G01R 33/035*　　(2006.01)
　　　*H01L 27/18*　　(2006.01)

(56)　　　　　References Cited

U.S. PATENT DOCUMENTS

| | | | |
|---|---|---|---|
| 5,099,294 | A * | 3/1992 | Hunt .................... H01L 39/223 |
| | | | 257/32 |
| 5,444,007 | A | 8/1995 | Tsuchiaki |
| 5,498,881 | A | 3/1996 | Fujimoto et al. |
| 5,550,101 | A | 8/1996 | Nagata et al. |
| 6,423,473 | B1 | 7/2002 | Sung et al. |
| 6,690,162 | B1 | 2/2004 | Schopohl et al. |
| 2004/0077504 | A1 | 4/2004 | Adachi et al. |
| 2004/0232405 | A1 | 11/2004 | Horibe et al. |

OTHER PUBLICATIONS

Written Opinion of the International Searching Authority for corresponding International Application No. PCT/AU2019/051139, dated Dec. 2, 2019, 4p.
Notice of Acceptance and Claims as allowed in Australian Patent Application No. 2019362096 dated Aug. 31, 2020, 7p.
International-Type Search for Provisional Patent Application in Australian Provisional Patent Application No. 2018903963 dated Apr. 5, 2019, 19p.

* cited by examiner

MULTIPLE STEP EDGE FABRICATION

PRIORITY

This application is the U.S. National Stage application of PCT application no. PCT/AU2019/051139, filed on 18 Oct. 2019, titled MULTIPLE STEP EDGE FABRICATION, designating the United States the content of which is incorporated herein by reference in its entirety. PCT application no. PCT/AU2019/051139 claims priority from Australian provisional application no. 2018903963 filed on 19 Oct. 2018, the contents of which are incorporated herein by reference in their entirety.

TECHNICAL FIELD

This disclosure relates to fabrication of step edges in a surface of a crystalline substrate. For example, but not limited to, this disclosure relates to fabrication of multiple step edges to fabricate Josephson junctions.

BACKGROUND

Extremely sensitive magnetometers are in high demand in a wide range of technology fields, including medicine (e.g., magnetoencephalography), mining (e.g., detection of ore bodies) and biology (e.g., monitoring of biological processes). A popular type of sensitive magnetometers is a superconducting quantum interference device (SQUID) that are used to measure extremely subtle magnetic fields.

At the heart of a SQUID is a superconducting loop with two quantum barriers in opposite loop paths. These barriers are also referred to as Josephson junctions and allow the tunnelling of superconducting electrons, which result in a voltage that depends on the magnetic field. This disclosure relates to the fabrication of these Josephson junctions. In particular, this disclosure relates to the fabrication of a step edge that can be the basis of a Josephson junction.

One technique for fabricating a Josephson junction is to use the direction of a superconducting crystal. More particularly, it is possible to grow the crystal in a particular direction on one side of the junction and in a different direction on the other side of the junction. When both meet in the middle (the "grain boundary"), the difference in crystal directions forms the barrier that then acts as a Josephson junction.

Growing crystals in different directions can be achieved by changing the direction of the surface on which the crystal grows. FIG. 1 illustrates a profile 100 of a superconductor substrate. Importantly, the profile 100 comprises a step edge 101, which is a sharp transition from a sloped surface 102 to a horizontal surface 103. There is usually a flat horizontal region between 102 and a smooth return path 104, with the return path 104 having a gradual gradient to the level of surface 103, which is a relatively smooth part of the profile 100 and ensures that the profile height returns back to the height of the horizontal surface 103 without a further step edge. PCT/AU99/00774 discloses a method of fabricating a step edge and is incorporated herein by reference.

FIG. 2 shows the result of growing crystal onto the profile 100 in FIG. 1. Importantly, this forms a grain boundary 201 where the different directions of crystal growth can be seen as they meet at the boundary 201. This results in a barrier that then constitutes the Josephson junction. A similar structure is fabricated on the other side of a superconducting loop (not shown) so that two junctions are in the loop. It is noted that the smooth return path 204 does not form a Josephson junction due to the smoothness of the return path 204, as well as the relatively low angle. It is also noted that the angle at the bottom of the step where 102 meets 104 (or 102 meets the flat horizontal section between 102 and 104) is also smooth so that no junction forms. This is important because, according to the understanding in the prior art, a second Josephson junction in this part of the loop would render the SQUID less sensitive or even unusable. Typically, the profile in FIGS. 1 and 2 is repeated so that the resulting profile resembles a sawtooth profile with a step edge 101 and a smooth return path 104.

It is further noted that the characteristic (i.e. critical current) of the Josephson junction can be tuned by changing the step angle 105 shown in FIG. 1. Further, the sensitivity can be further increased by combining a large number of SQUIDs into an array. However, with an increasing number of SQUIDs in the array, it becomes a problem that the smooth return path 104/204 uses a significant amount of space that cannot be used for further SQUIDS. Further, the smooth return path 104/204 also introduces variations in the crystal which are difficult to control and as a result, the crystal is of poorer quality, may also consist of multiple randomly oriented crystals, and may be damaged easily.

FIG. 3 illustrates a Josephson junction in plan view again comprising a step edge 301 (the dashed line), a sloped surface 302 (dark shaded area), a horizontal surface 303 and smooth return path 304 (light shaded area). The solid outline 305 delineates areas of crystal growth. It can be seen that there are also sidewalls which are orthogonal to the step-edge 301 and use further area. The crystal is removed from the side walls 306 to prevent poor Josephson junctions forming. The step edge angle is defined by an ion beam that is directed at the substrate at a particular angle. Therefore, if the shown device is replicated many times on the chip, all step edges on the same chip have the same orientation, limiting the options available for device design. Further, step-edge morphology varies with distance from the ion beam, so it can differ between the top and bottom of the substrate. This contributes to junction device parameter variability, which reduces device efficiency (arrays) and reliability. Junction uniformity—superconducting junction parameters vary by as much as 30% or more across chip.

This shows that there is a need to improve the existing methods and address the problems described above.

SUMMARY

A method of forming multiple step edges in a surface of a crystalline substrate comprises:

forming a layer of resist over the surface, the layer of resist comprising openings to expose a selected area of the surface, thereby forming two walls in the layer of resist on a perimeter of the selected area; and exposing the resist and the substrate to an ion beam, thereby etching the resist and the exposed areas of the surface;

while exposing the resist and the substrate to the ion beam, gradually rotating the substrate about an axis normal to the surface to thereby form two step edges at the respective two walls; and depositing superconducting material onto the substrate in a meandering shape to form a path that crosses the two step edges multiple times and to form a Josephson junction each time the path crosses one of the two step edges.

At least four junctions may be formed and the four junctions may be connected in series by the path.

At least eight junctions may be formed.

The two walls may be substantially parallel and opposing each other.

Each of the multiple step edges may define an upper level and a lower level and the superconducting material may be deposited to form a first path section that crosses one of the two step edges from the upper level to the lower level; a second path section that crosses the same one of the two step edges from the lower level to the upper level; and a first connection on the lower level that connects the first path section to the second path section without reaching the upper level.

The first connection may be parallel to the one of the two step edges.

The first path section, the second path section and the first connection may form a first loop and material may be deposited to form a second connection to connect the first loop to a second loop deposited on a different one of the two step edges.

The superconducting material may be deposited onto the substrate to form a loop comprising two Josephson junctions each time the path crosses one of the two step edges.

The superconducting material may be deposited onto the substrate to form an array comprising more than two Josephson junctions each time the path crosses one of the two step edges.

Gradually rotating the substrate may comprise continuously rotating the substrate. Continuously rotating the substrate may comprise rotating the substrate at a constant rotation rate. The rotation rate may be greater than one rotation during exposing the resist and the substrate to the ion beam. The rotation rate may be more than 1 rotation per minute. The rotation rate may be more than 10 rotations per minute.

The two walls may be opposing each other on either side of the exposed area and a distance between the two opposing walls may be less than 20 μm. Junction parameters of the Josephson junctions may be identical within manufacturing variations.

The selected area may comprise multiple shapes each having two walls forming two respective step edges and the path crosses the two step edges of each shape multiple times. The shapes may be rectangular and arranged side by side such that the path crosses the two walls of all of the shapes in a straight line.

A device comprises:

two walls in a surface of a crystalline substrate on a perimeter of an etched area;

a step edge at each of the two walls;

a meandering path of superconducting material deposited onto the substrate, the path crossing the two step edges multiple times; and a Josephson junction formed within the path each time the path crosses one of the two step edges.

The device may comprise at least four Josephson junctions connected in series formed within the path. The device may comprise at least eight Josephson junctions.

A distance between the two step edges may be less than 20 μm.

Optional features of one of the method and the device are also optional features of the other of the method and the device.

DESCRIPTION OF EMBODIMENTS

This disclosure provides a method for fabricating step edges which opens up new degrees of freedom for junction positioning and orientation on a chip, and thus introduces new potential for device designs. The disclosed method may provide four key advantages over the current state-of-the-art:

(1) Junction formation is axially unconstrained, and no longer limited to the resist edge facing the ion beam—junctions can be formed wherever there is a resist edge. This introduces the potential for new device designs.

Figure 1:
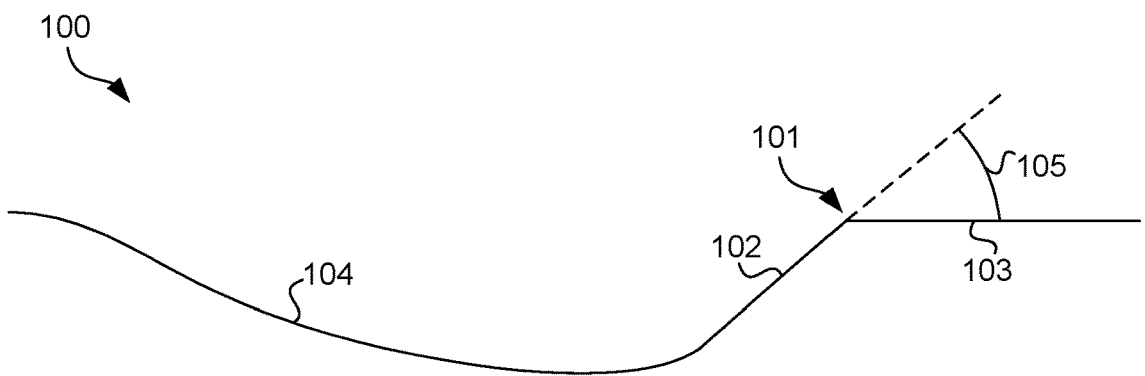
FIG. 1 illustrates a profile of a superconductor substrate according to the prior art.
Figure 2:
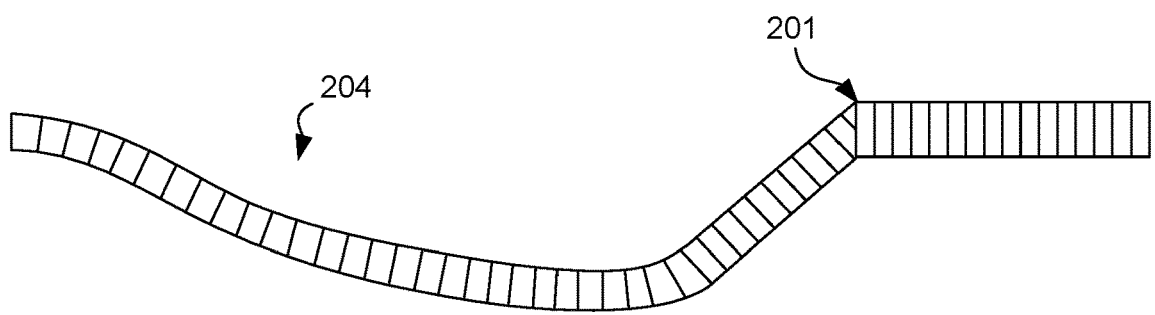
FIG. 2 shows the result of growing crystal onto the profile in FIG. 1 according to the prior art.
Figure 3:
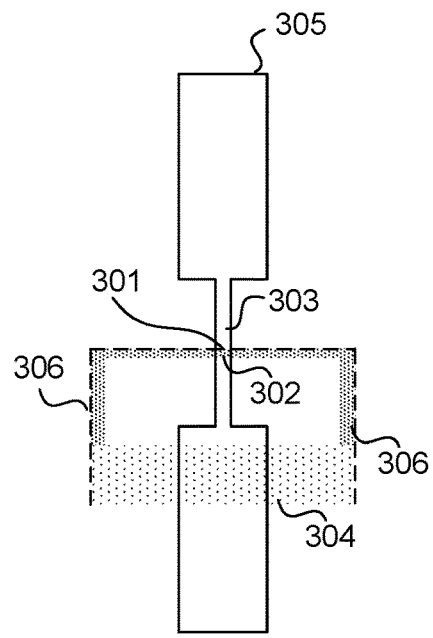
FIG. 3 is a plan view of a Josephson junction according to the prior art. Two of these junctions in parallel across the same step edge form a superconducting quantum interference device (SQUID) according to the prior art.

(2) The smooth return path is eliminated, changing the sawtooth profile in FIGS. 1 and 2 to a trench profile, for example, with two opposing step edges, increasing the number of step edges that could be fabricated in a smaller area, reducing manufacturing costs.

(3) The density of junctions may be significantly increased, which is important for some device performance.

(4) The step etch rate is more uniform over the substrate during step edge formation. Variation in in step-edge morphology due to sample proximity to the ion source may be halved due to the substrate holder rotation.

The methods disclosed herein can be used in all step-edge Josephson's junction devices such as SQUIDs, gradiometers, high frequency mixers and superconducting quantum interference filters (SQIF). In the case of SQIF devices, more junctions could be fabricated in a smaller area which will increase device performance. This has applications involving magnetometry such as geo-exploration, non-destructive evaluation, health sciences (biomagnetism and medicine), RF sensing and detection and communications, including satellite communications.

Figure 4:
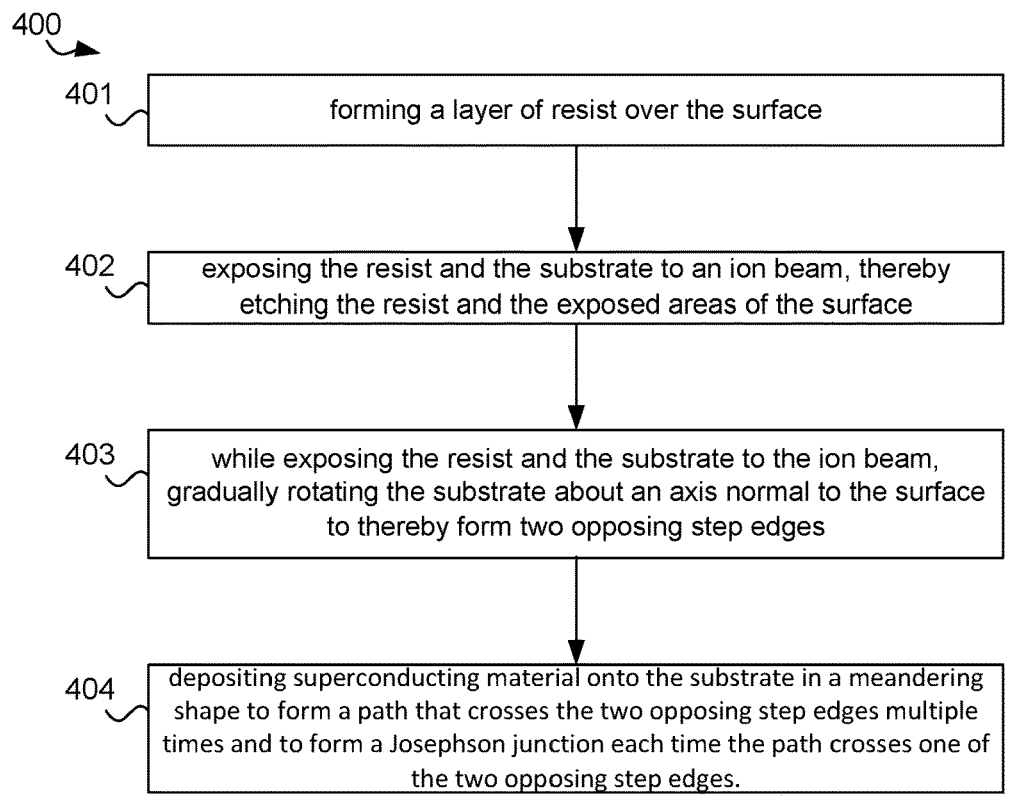
FIG. 4 illustrates a method of forming multiple step edges in a surface of a crystalline substrate.

FIG. 4 illustrates a method 400 of forming multiple step edges in a surface of a crystalline substrate. The method comprises forming 401 a layer of resist over the surface. The layer of resist comprises openings to expose selected areas of the surface. For example, this layer can be formed by deposition of a layer of photo-resist on the surface of an MgO substrate or another suitable substrate and removing areas of the resist to expose selected areas of the surface using known photolithography techniques. This involves preparing a mask that is open for the selected areas, placing the mask on the photo-resist, directing light at the mask and removing the mask. In some examples, the opening in the mask has a rectangular shape. The areas of the photo-resist that were subjected to the light can then be removed. In this way, two opposing parallel walls are formed in the layer of resist on the perimeter and as the side walls of a rectangular depression, which is referred to as a 'trench' herein. As a result, the two walls are opposing each other. A negative resist can also be used for the same effect (where exposed areas of resist remain, while unexposed areas are removed). It is noted that it is equally possible to use alternative material, such as a hard mask to photoresist to pattern steps during step edge formation, for example a metal deposited by sputtering or e-beam deposition, or a ceramic material or alloy deposited by sputtering. This material can be deposited using positive or negative photo-resist to make the pattern. For example it could be deposited using a lift-off process.

It is noted that in some examples, the walls define a square or a rectangle (i.e. a trench) on the substrate and there are four walls on the perimeter of the trench which differ in their orientations by 90 degrees between neighbouring sections. In other examples, however, the shape of the depression may be more complex, including hexagonal or other regular or irregular polygons. In yet further examples, the walls are not straight/planar but curved and may define a circular depression. In this sense, multiple wall sections flow continuously into each other along the perimeter of the area and at a first point along the wall the orientation is different to the orientation at a second point. In this case there may be an infinite number of wall sections that could be defined. A wall may have a varying surface orientation along the wall and not every point along the wall has the same orientation. In other words, the wall may not be a single planar surface (but may comprise multiple planar surfaces), noting that in the example of a rectangular trench, each of the opposing walls are single planar surfaces. It is noted that the walls are on the perimeter of the area that is selected for exposure and etching.

The next step of method 400 is exposing 402 the resist and the substrate to an ion beam. This etches the resist and the exposed areas of the surface. While exposing the resist and the substrate to the ion beam, the substrate is gradually rotated 403 about an axis normal to the surface to thereby form a step edge at each of the two opposing walls.

Figure 5:
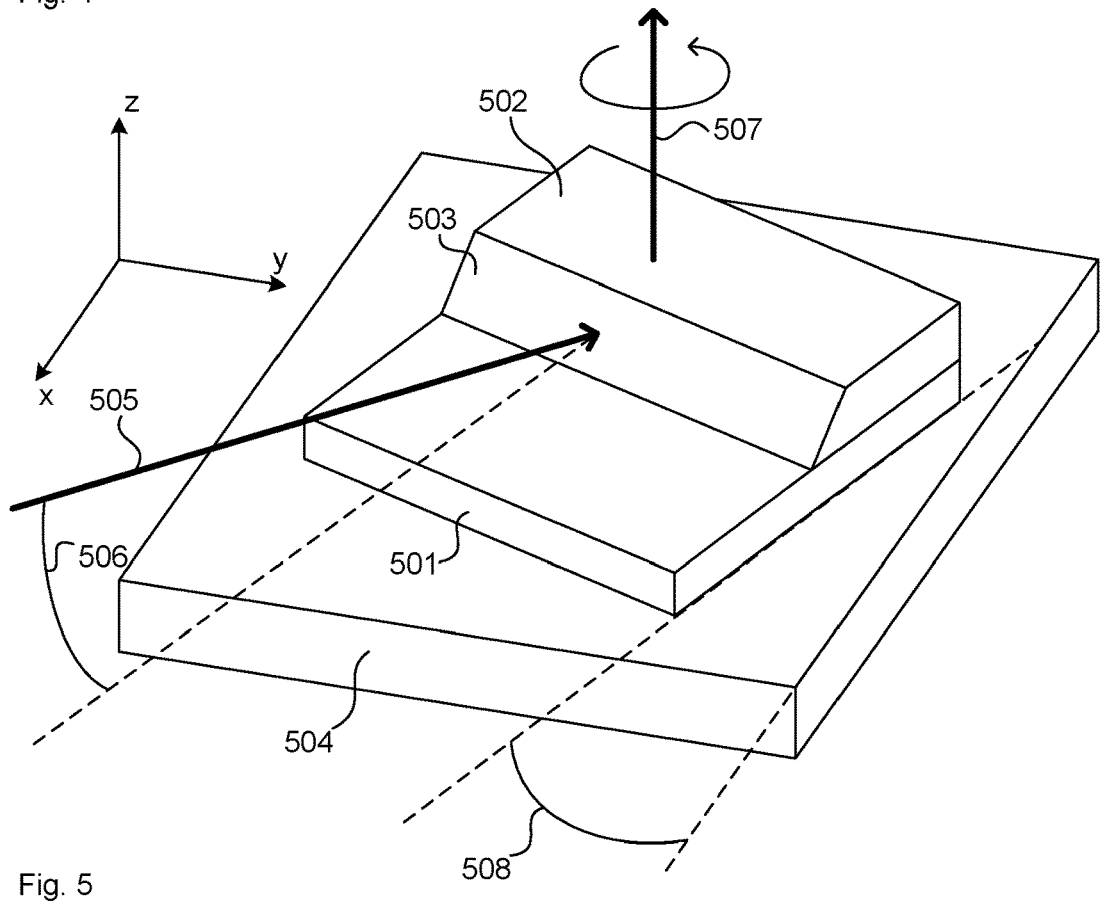
FIG. 5 illustrates a substrate rotated by a substrate holder and subjected to an ion beam.

The gradual rotation may be a continuous rotation, such as at a rotation speed of 20 rotations per minute during an exposure of 15-20 minutes, or a rotation speed of 60, or even 120 rotations per minute, for a similar exposure time of 15-20 min (exposure time is dependent on angle 506 (FIG. 5). Other rotation rates may equally apply and may be dependent on a range of manufacturing parameters, such as greater than one rotation during the entire exposure time of the resist to the ion beam or more than 1 rotation per minute or more than 10 rotations per minute. In other examples, the gradual rotation may be a rotation at varying speed or in small steps, such as less than 10 degrees in each step or less than 5 degrees or less than 1 degree. It is further noted that in most examples, the rotation comprises multiple full (×*360°) rotations. But in other examples, the rotation may comprise less than a full rotation, such as a half (180 degrees) or a quarter (45 degrees).

It is important to note that the rotation is performed while the resist is exposed to the ion beam. This means the ion beam is not turned-off to rotate the chip but instead, the ion beam remains turned on during the rotation so that the etching occurs at all angles of the rotation.

The method then continues by depositing 404 superconducting material onto the substrate in a meandering shape. This forms a path that crosses the two opposing step edges multiple times. Further, this step forms a Josephson junction each time the path crosses one of the two opposing step edges as will be described below with reference to FIG. 6.

Returning back to the different shapes that the walls can define, it should be noted that there may be a wall that forms a step edge and an opposite wall such that a second step edge is formed in a return path of the first step edge. It is noted here that the term "return path" is used to indicate any path that returns from a lower level back to the upper level of the substrate. In FIGS. 1 and 2, the smooth return path 104/204 is smooth in the sense that the return path has a gradual gradient to the upper level, having no edge when it reaches the upper level and therefore, no junction is created. In contrast, with using the methods and systems disclosed herein, the return path does comprise an edge and a junction is formed as will be shown in FIG. 9 and FIG. 14. It is further noted that in symmetrical structures, such as trenches, the "return path" may be considered to lie on either one of the opposing side walls. In another example where the concept of a return path does not directly apply, two walls are located perpendicular to each other such that two step edges are fabricated that are also perpendicular to each other. In this example, it will often be the case that both walls are adjacent to the same exposed area of the surface and may even bound the exposed area of the surface. For example, if the exposed area is a rectangle, there are four walls that bound/define the rectangle and a step edge is formed on each of the four sides of the rectangle.

FIG. 5 illustrates a superconductor substrate 501, such as MgO or other suitable substrate, during fabrication. Substrate 501 has a layer of photoresist 502 disposed thereon which forms a wall 503 (further walls are not shown for clarity) as a result of the previous photolithography steps.

Substrate 501 is mounted on a substrate holder 504 and an ion beam 505 is incident on the wall 503 at an inclination angle 506 between the plane of the substrate 501 and the ion beam 505. The inclination angle 506 may preferably be 20 degrees in some examples but may also be any angle between 10 and 80 degrees or even between 0 and 90 degrees. In another example, the angle is between 10 and 50 degrees. While the ion beam 505 is incident on the wall 503, the substrate holder 504 gradually rotates the substrate 501 (and photoresist 502) about a rotation axis 507. This gradually changes the azimuth angle 508.

This substrate holder 504 may have the following features:
(1) It can be tilted towards the ion beam 505 at a chosen inclination angle to control the step angle 105 (see FIG. 1).
(2) It can be rotated at a controlled rate during ion etching The rotation of the substrate holder during ion etching opens up new degrees of freedom for step edge formation on a patterned chip. For example, for an MgO substrate patterned with a typical rectangular shaped photoresist step edge pattern of exposed MgO surface, a step edge will now be formed on all four sides of the resist, where previously the step edge would have been formed only on one side, with two side walls and one smooth return path making up the other three sides.

Figure 6:
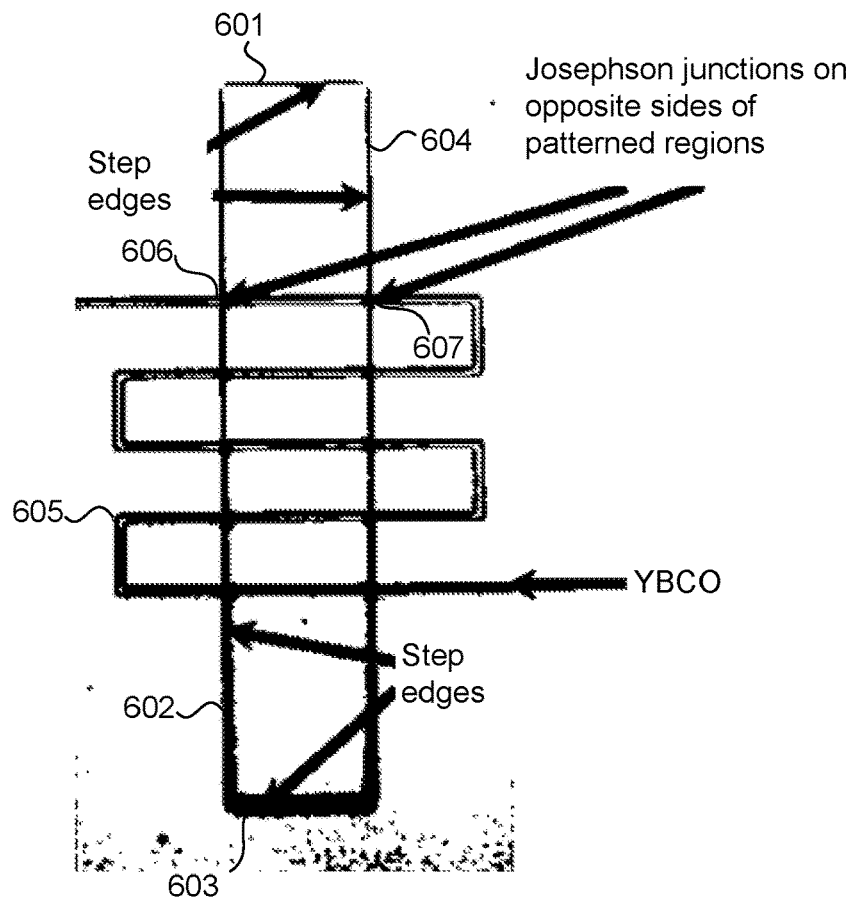
FIG. 6 shows an example device. Four step edges patterned around a rectangle by use of the rotating substrate holder. In this case Josephson junctions have been patterned on opposite sides of the etched rectangular area. It is possible to utilise all four edges of this rectangular pattern for Josephson junction formation.

FIG. 6 shows an example device with four step edges 601, 602, 603, 604 fabricated according to method 400 in FIG. 4. A meandering YBCO path 605 was also deposited as shown. As a result, Josephson junctions 607 are formed on opposite sides of the patterned rectangular region. Due to the meandering path as shown in FIG. 6, the superconducting material forms a path that crosses the two opposing step edges multiple times. In other examples, junctions may also be placed on the top and bottom horizontal edges, making use of all four sides of the etching window. Previously this was difficult using the state of the art technique of step edge formation.

With the method disclosed herein, it may be possible to fabricate a higher density of step edges on a single chip, as there will no longer be space used by the presence of a smooth return path or side walls. This may help with scaling up the number of the junctions on a single substrate and make the process more appealing to manufacturers.

In some cases the performance is directly linked to the number of junctions in an array. Therefore this technique also has the potential to improve device performance. This process may also improve the on-chip uniformity of step edge junctions, and thus improve reliability of junctions across a substrate.

Figure 7:
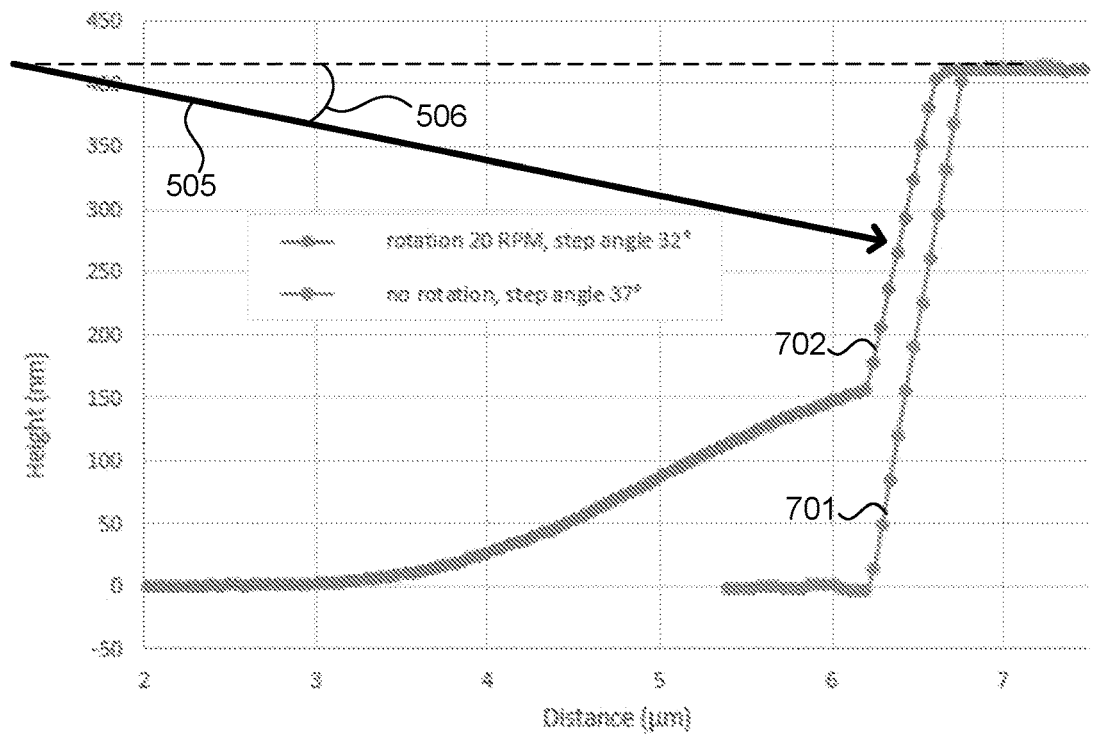
FIG. 7 shows a cross section profile of MgO substrate step edges.
Figure 8:
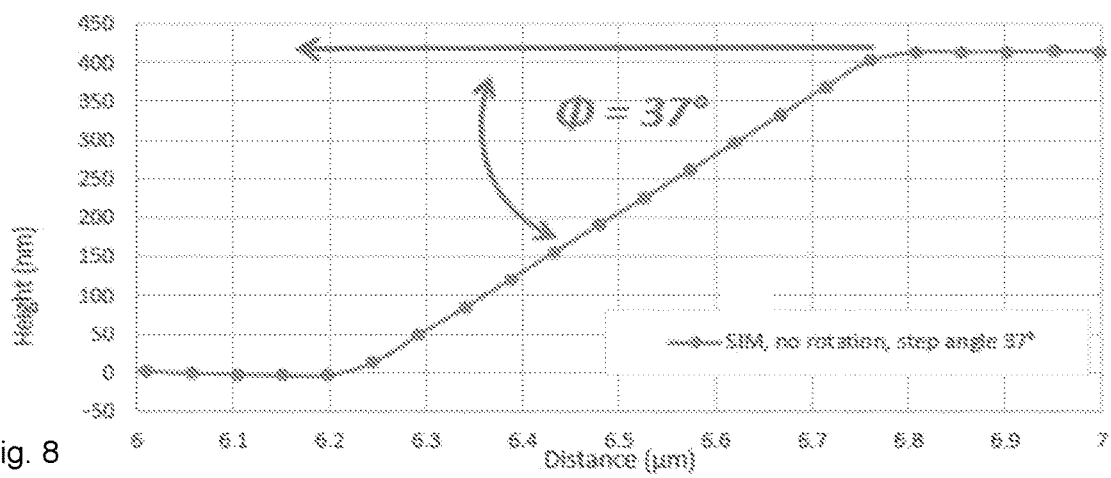
FIG. 8 shows an AFM cross section scan showing how Φ is determined.

FIG. 7 shows a cross sectional comparison between two step edges after the first etch and prior to the second etch. One is prepared by the original method of creating step edge (701, without substrate holder rotation) and one is prepared by the method involving use of the rotating substrate holder (702). For illustration purposes, FIG. 7 also shows the ion beam 505 and angle 506 from FIG. 5, which is shown in-plane (parallel to the plane of the drawing) for clarity. For the case without rotation 701, the ion beam 505 would remain in-plane but for the rotation case 702, ion beam would gradually change and rotate out of the plane of the drawing and eventually hit the opposite wall (not shown) such that the shown step edge would essentially lie in the shade. It is noted that FIG. 7 shows the right hand portion of FIG. 9 discussed below. The surface morphology at the bottom of the step and the step angle (I) (see FIG. 8) are slightly different, but this change in morphology should not affect device function and the step angle can be engineered by adjusting the substrate holder angle. In particular, the step edge 702 has a height profile that varies along a distance from the step edge as a result of exposing the resist and the substrate to an ion beam while gradually rotating the substrate about an axis normal to the surface to thereby form a step edge. In this example, the profile 702 is less abrupt and changes more gradually than profile 701. It can be seen that profile 702 extends from 2 µm to 6.5 µm, which means an opposing side wall could be placed within about 5 µm from the step edge 702. While the non-rotating step edge 701 is steeper and therefore appears to occupy less space, an opposite step edge is not formed due to the static configuration of the ion beam 505 and a smooth return path is formed instead over about 16 µm, which is not shown due to the limited space on the x-axis.

Figure 9:
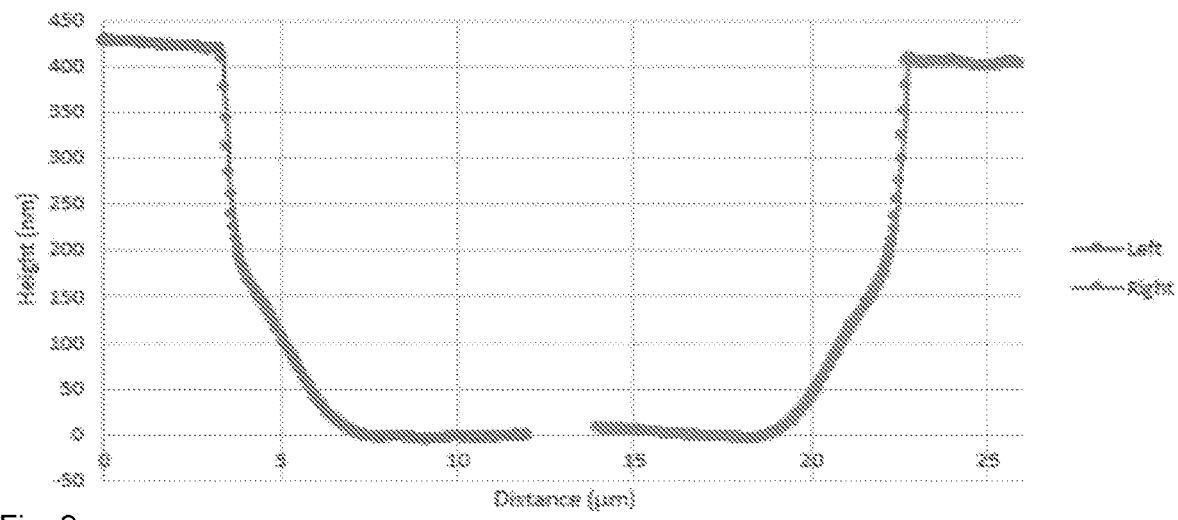
FIG. 9 shows two Atomic Force Microscope (AFM) cross sections from opposite step edges, approximately 20 μm apart, and both formed by the disclosed method of multiple step edge fabrication to form axially unconstrained step edges. Due to limitations of the AFM system, two images are stitched together to show the cross section morphology.
Figure 10:
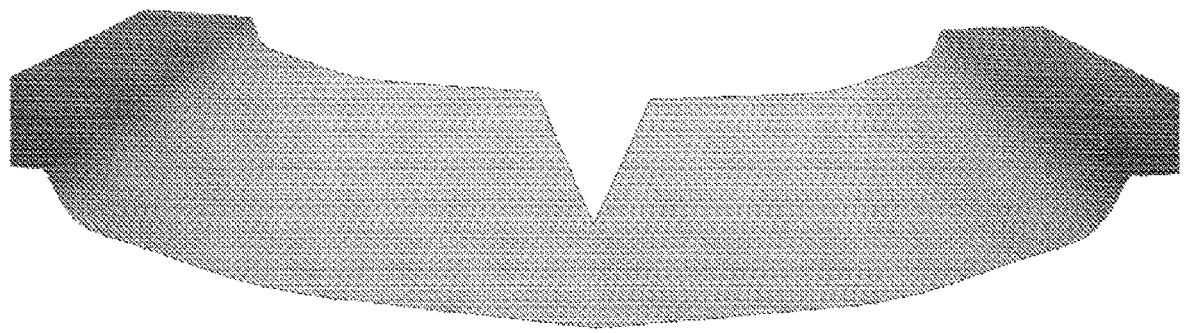
FIG. 10 shows 3D AFM Scans (12×12 μm) of step edges on opposing sides of a patterned region of MgO formed using the disclosed methods at the same location as FIG. 8.

FIG. 9 shows the cross sections of two opposite step edges formed only 20 µm from each other within the same photolithography window. This can be reduced to as low as 16 µm or less in other example designs. This is in contrast to previous technologies that rely on smooth return paths, usually up to 6 µm wide, where the distance between step edges would be at least 32 µm. As a result, the method disclosed herein allows the manufacturing of arrays with an increased density of step edges. It is noted that the distance of 20 µm is not a theoretical limit and depending on the manufacturing technology, a distance of less than 20 µm, such as less than 16 µm or even less than 5 µm is possible. FIG. 10 shows the three dimensional AFM images of the same scanned areas shown in FIG. 9.

EXAMPLE

Figure 11:
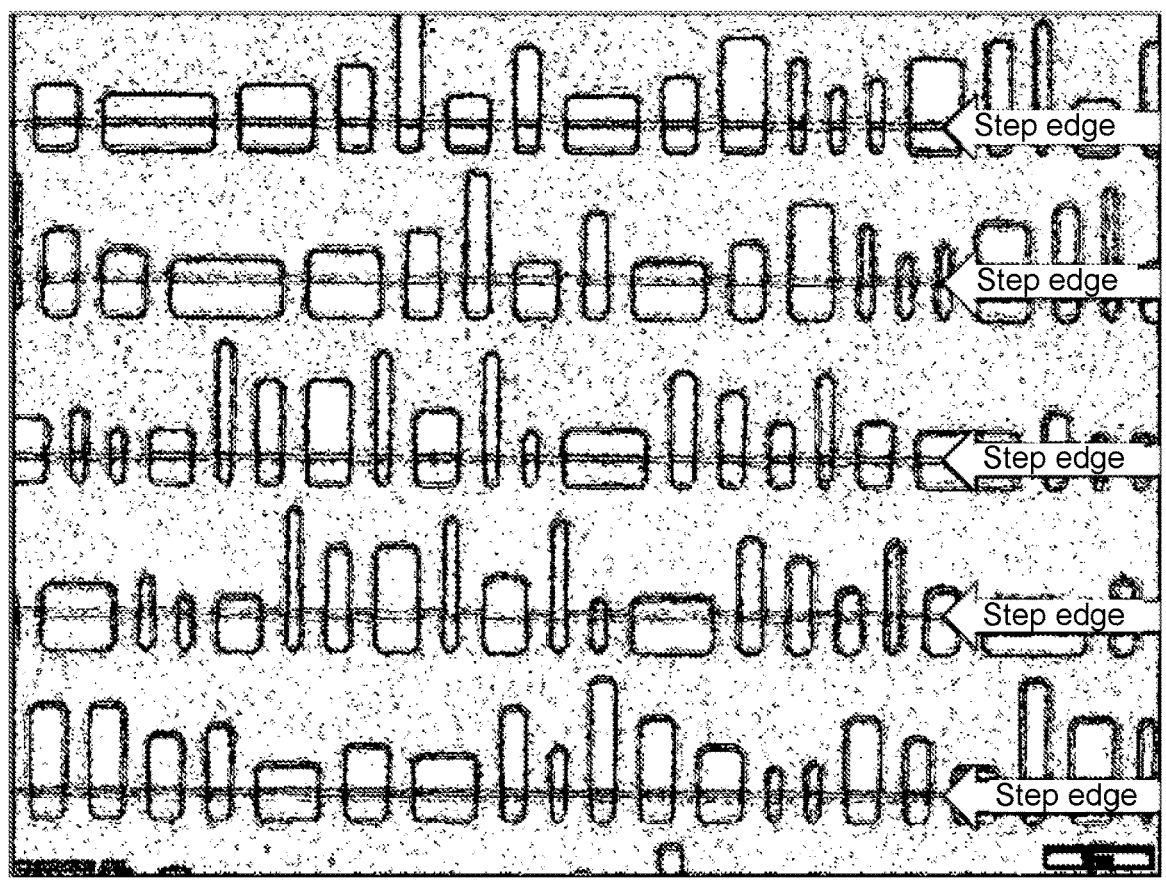
FIG. 11 shows an array of step-edge Josephson junctions (Magnification ×500) produced using the rotating substrate holder of FIG. 5.

An array of 16,700 step edge Josephson junctions has been prepared using the rotating substrate holder 504. This array utilises the principles of SQIF design, whereby greater than a thousand SQUID loops of varying size are fabricated in series and parallel in an array, in order to get a large voltage response to small changes in magnetic field. The voltage response from individual SQUID loops adds together via constructive interference to form an anti-peak around zero magnetic field, and destructive interference of the SQUID loop voltage response at non-zero magnetic fields. The array design was not optimised for the new type of junctions, however, a device was prepared as a proof of concept. FIG. 11 shows an image of the array with step edges highlighted by arrows, and where the lack of the return path is noted.

Figure 12:
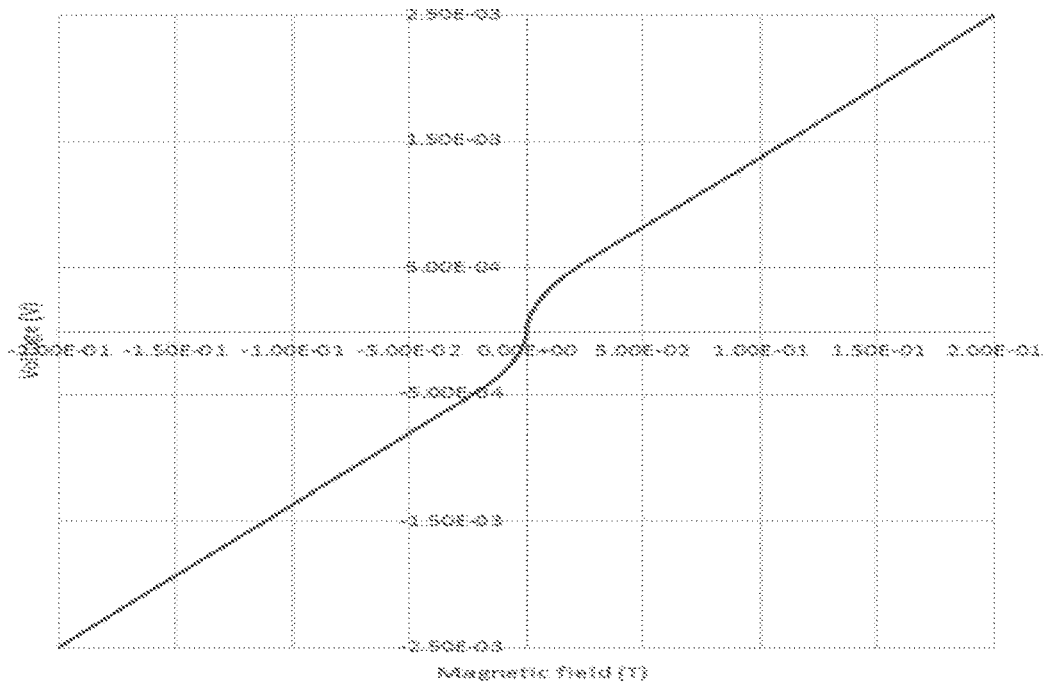
FIG. 12 shows a current vs voltage response measured for the array in FIG. 11.

The observations from this device are as follows:

The device gave the expected I-V response for Josephson junction arrays as shown in FIG. 12.

Figure 13:
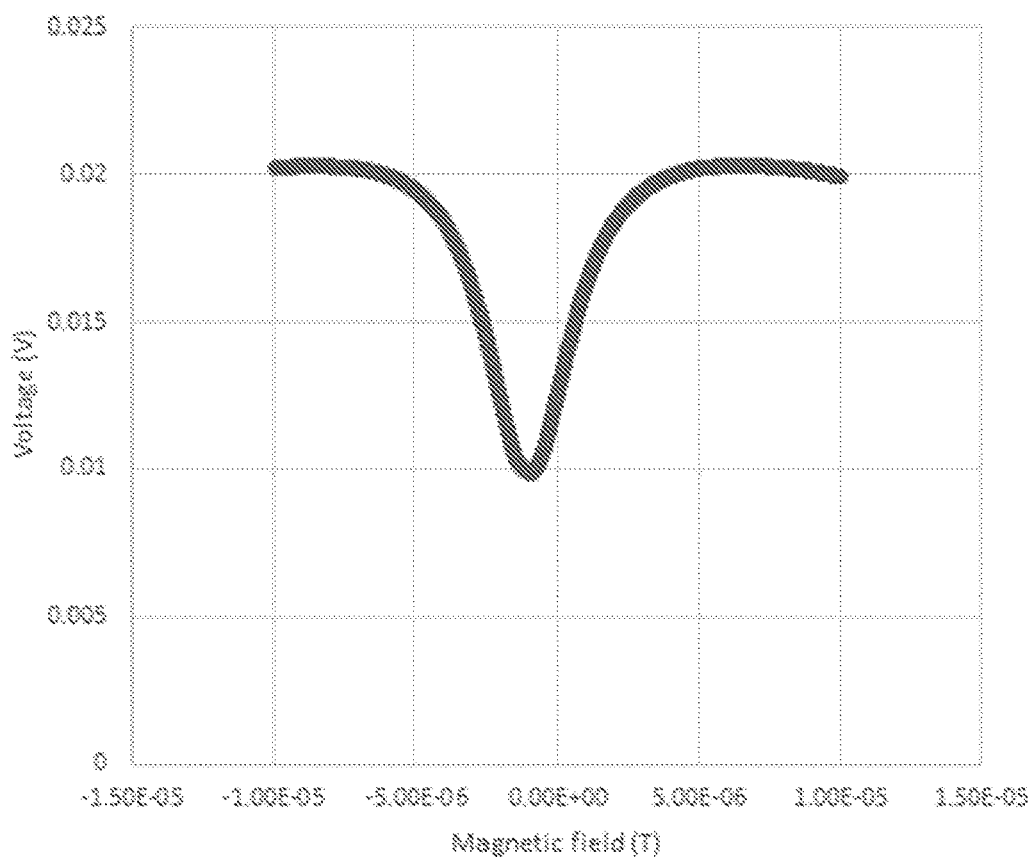
FIG. 13 illustrates a measured response to a magnetic field for the array in FIG. 11.

The device also gave the expected SQIF voltage response to magnetic field as shown in FIG. 13.

These results show that the step edges formed by the rotating substrate holder perform as expected and have similar properties to those produced by the state-of-the-art technique described in C. H. Wu et al., "High quality step-edge substrates for high-Tc superconducting devices," Review of Scientific Instruments, vol. 77, no. 3, 2006 and E. E. Mitchell et al., "2D SQIF arrays using 20000 YBCO high R n Josephson junctions," Superconductor Science and Technology, vol. 29, no. 6, p. 06LT01, 2016.

C. Foley, "Formation of step edge in surface of crystalline substrate, involves selecting angles between incident axis of ion beam and surface of substrate, and between incident axis of beam and resist side walls," Patent WO200016414-A1; AU9958424-A; GB2357917-A; DE19983559-T;

GB2357917-B; US6514774-B1; DE19983559-B4, Available: <Go to ISI>://DIIDW:2000271657.

E. E. Mitchell and C. P. Foley, "YBCO step-edge junctions with high I c R n," *Superconductor Science and Technology*, vol. 23, no. 6, p. 065007, 2010.

The proposed process has the following advantages over existing process:
(1) Junction formation is axially unconstrained, and no longer limited to junction formation at the resist edge furthest from the ion beam (within the opening in the resist)—junctions can be formed wherever there is a resist edge. This introduces the potential for new device designs.
(2) The smooth return path is eliminated, increasing on-chip real-estate and allowing for increased density of junctions per unit area and reducing manufacturing costs.
(3) The density of junctions may be increased, which is important for some device performance.
(4) Step-edge morphology is more uniform over the substrate area leading to better junction uniformity.

The proposed method also allows a large range of step edge angles to be selected (10-80°, or 10-50°) with commensurate control over critical junction parameters such as the critical current and normal resistance, and with high quality junctions. It is further noted that the step edge angle can be identical for all step edges, such as opposing step edges described below. This also means that the critical junction parameters are identical. "Identical" in this context means that the design sets these parameters as identical but of course, they are subject to manufacturing variations, which can be significant. For example, the step angle may vary by about plus/minus 1 degree or plus/minus 2 degrees and further variations, such as film quality, may lead to variations in critical current of about 20%, or 10% or 5%. Identical junction parameters are advantageous in a range of applications, such as SQIFs with a large number of loops, for example.

Figure 14:
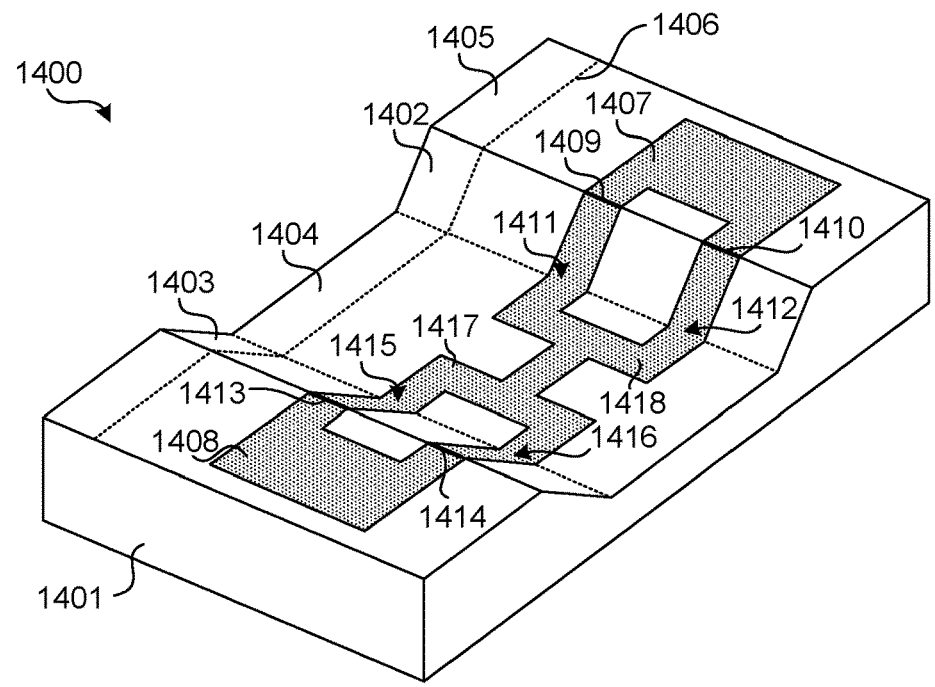
FIG. 14 illustrates an example array device with two opposing steps in a trench configuration.

FIG. 14 illustrates an example device 1400 having a substrate 1401 with two opposing steps 1402 and 1403 delimiting a lower level 1404 from an upper level 1405. When comparing FIG. 14 to FIG. 5, it is noted that in FIG. 5 the photoresist 503 is still present and the substrate 501 has not yet been exposed to the ion beam 505 to manufacture the multiple step edges. FIG. 14 shows the device after those steps, which means the photoresist has been removed and the steps 1402 and 1403 have been created. The lower level 1404 is where no photoresist had shielded the substrate from the ion beam 505 and corresponds to the "exposed area" mentioned above. It is further noted that the profiles in FIG. 9 are taken along dashed line 1406 in FIG. 14.

Device 1400 further comprises a first loop 1407 and a second loop 1408 made of superconducting material, such as YBCO, that has been deposited onto substrate 1401 as shown in FIG. 2 but without smooth return path 204. Similar to step edge 101 in FIG. 1 that forms grain boundary 201 in FIG. 2 (i.e. Josephson junction), the first loop 1407 forms two Josephson junctions 1409 and 1410 on the upper step edge of first step 1402. It is noted that there are no further junctions at the bottom of step 1402 (indicated at 1411 and 1412) because the bottom is rounded as shown in FIGS. 2 and 9, which is indicated by the dashed lines in FIG. 14.

Comparing FIG. 14 again to FIG. 2, instead of smooth return path 204, there is the second step 1403 on the return path on which second loop 1408 is formed. In this sense, instead of the sawtooth profile of FIGS. 1 and 2, there is now a trench profile where the edges of the two opposing side walls 1402 and 1403 face each other. In this example, the edge between upper level 1405 and side wall 1402 is parallel to the edge between upper level 1405 and side wall 1403. The same could be said about the lower level 1404 but this is more difficult to define due to the rounding of those edges. As a result of the trench structure shown in FIG. 14, there are two further junctions 1413 and 1414 that are not present in FIG. 2 by the smooth return path 204 but now used in the second loop 1408. It is noted that the further junctions 1413 and 1414 are collinear with each other and parallel to step edges 1409 and 1410, which are also collinear to each other due to the trench structure. Again, there are no further junctions at the bottom of second step 1403. Each of the loops 1407 and 1408 now acts as a SQUID to detect a magnetic field and together they have a higher sensitivity than a single loop Importantly, the two loops 1407 and 1408 may or may not be connected to each other. When un-connected they form two separate SQUIDs and when connected they form a SQUID array. In all cases, within the lower level 1404 they have a connection 1417 and 1418, respectively, that is parallel to the respective steps 1402 and 1403 (but not necessarily parallel). In this sense the path taken by the deposited material forming loop 1407, leads down step 1402 forming a first path section from upper level 1405 to lower level 1404 and returns back up the same step 1402 in the opposite direction forming a second path section from lower level 1404 to upper level 1405 without crossing another step in between and without reaching the upper level 1405 in-between to form a loop. As a result, there are now two loops 1407, 1408 in an area that would have previously been taken up by the step and smooth return path of a single loop. Importantly, the lower area 1404 would be larger for a smooth return path than for two steps 1402 and 1403, which means that the increase in density is significantly more than twice the previous densities as two loops now fit into an area that is smaller than the area previously required for a single loop. In other words, FIG. 14 now defines a trench shape whereas FIG. 2 defines a sawtooth shape between two adjacent step edges.

Figure 15C:
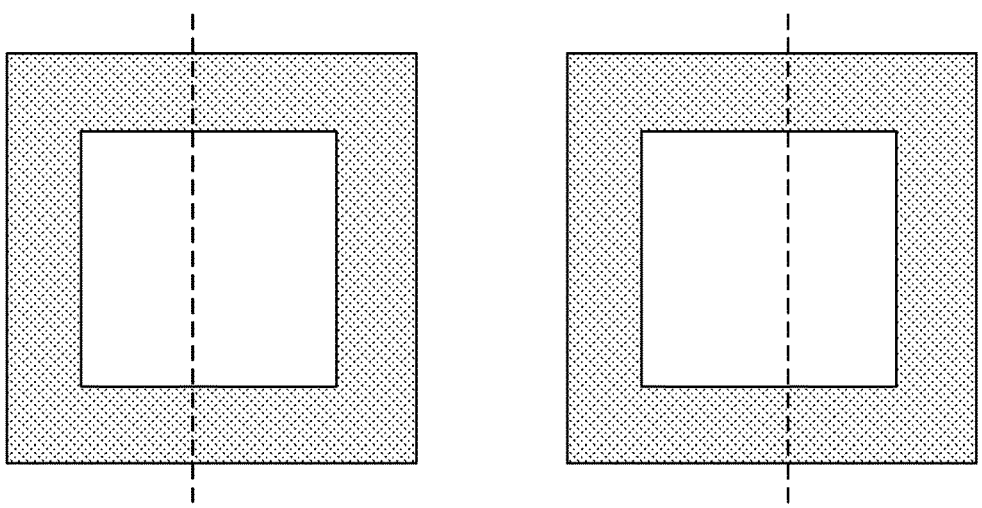
FIGS. 15a, 15b and 15c show example configurations in 2D of two loops on opposite step edges as shown in 3D in FIG. 14.
Figure 15B:
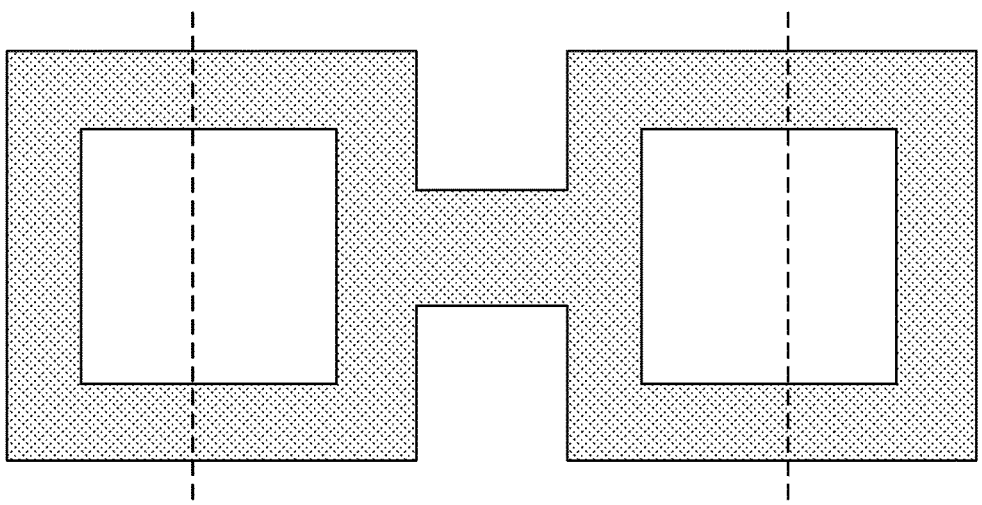
Figure 15A:
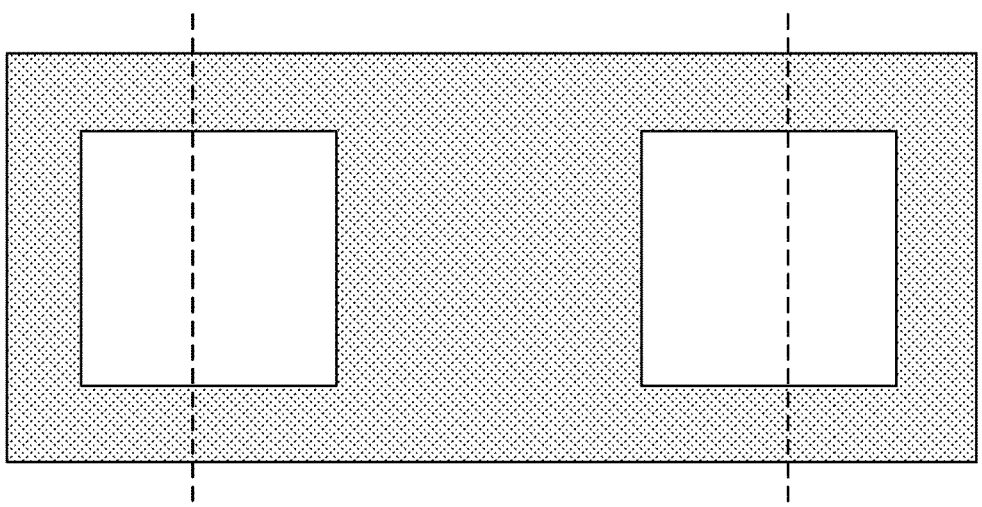

FIGS. 15a, 15b and 15c show how the loops 1407 and 1408 can be connected. This may be important and necessary for SQIF arrays. The dashed lines are the step edge and the solid lines define YBCO area. FIG. 15a shows unconnected and FIG. 15b and FIG. 15c show different ways the loops may be connected. In particular, in FIG. 15c, there is a contiguous area, such as a rectangle in this case, and the loops are formed by cut-outs (e.g. square or rectangular) from this area.

In a further example, a device comprises two opposing walls in the surface of the crystalline substrate in the sense that a trench (also referred to as trough) lies between the walls and the surfaces of the walls face each other. The trench is formed where openings are in the resist so that the area that later forms the trench is exposed to an ion beam to etch the exposed area to form the trench. The trench is rectangular in this case and the walls are the opposite sides of the trench. Superconducting material is then deposed on the substrate in a meandering shape. This means the superconducting material forms a path that crosses the trench multiple times from side to side. In other words, the path crosses the trench in one direction, returns in an opposite direction, crosses again in the first direction, returns in the opposite direction and so on. The turning point, that is a 180 degrees turn or U-turn may be formed by two 90 degrees turns or right angle corners in the sense that the path abruptly changes direction by 90 degrees. Alternatively, the corners may be rounded or have other shapes, including quarter circles or continuous curvature.

Preferably, the angle (i.e. steepness) of the walls of the trench in the substrate are identical (within manufacturing variations), which results in an identical junction parameters, such as critical current on either side of the rectangle.

By crossing the step edges multiple times, each time a Josephson junction is formed due to the grain boundaries at the step edge (with identical junction parameters). This means if the path crosses the trench and returns a single time, there are at least four Josephson junctions in the path. These include a first junction going down into the trench over the first step edge, a second junction going up out of the trench over the second step edge, a third junction after turning around and again going down into the trench over the second step edge and finally a fourth junction going up out of the trench over the first step edge. In this case, there are four junctions connected in series since the path of superconducting material provides a connection between the junctions. There may be additional junctions in parallel at each crossing as described below.

In some examples, the total number of junctions is at least eight. This may be the case when there are two junctions in parallel at each crossing, which together form a respective SQUID loop. So there are at least four SQUID loops including a first loop going down into the trench over the first step edge, a second loop going up out of the trench over the second step edge, a third loop after turning around and again going down into the trench over the second step edge and finally a fourth loop going up out of the trench over the first step edge. In this case, the four loops are connected in series since the path of superconducting material provides a connection between the junctions.

It is noted that a single meander goes through the trench twice in opposite directions (there and back) and may be referred to as a building block, or simply 'block'. A block can be repeated many times along the trench to create a large number of junctions or loops. Each block comprises two 'arms' where the path goes through the trench and each arm comprises two step-edge crossings (down and up). As a result, each block comprises four crossings. The two arms may be parallel connected or series connected. Each crossing of a block may comprise a single junction or two junctions forming a loop, such that each block comprises either four junctions or four loops with eight junctions in total. Combinations of loops and junctions and parallel and series connected arms are also possible.

Figure 16:
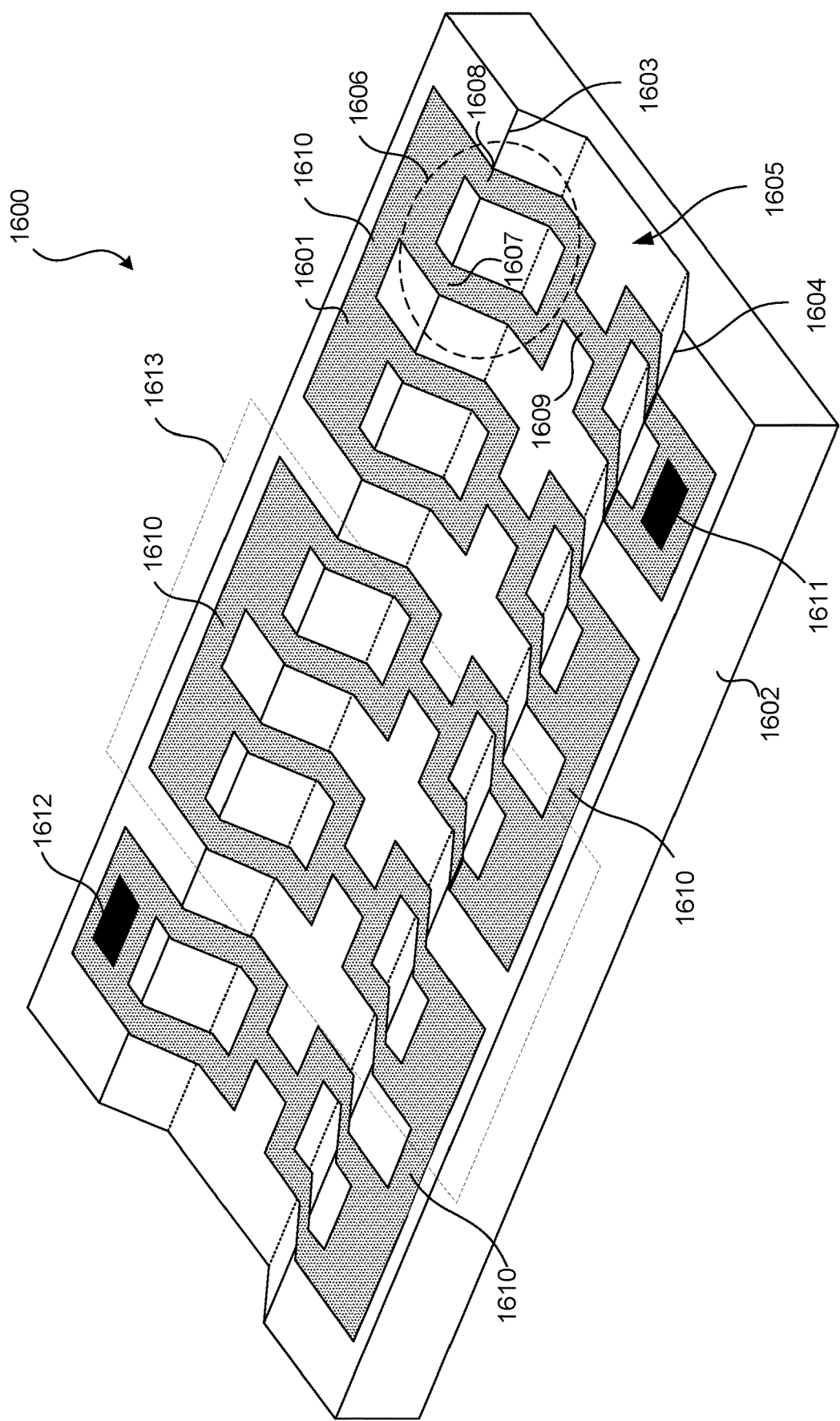
FIG. 16 illustrates an example device with a meandering superconducting path and a Josephson junction at each crossing of the path over one of the two opposing steps.

FIG. 16 shows an example device 1600 similar to FIG. 6 in the sense that there is also a meandering YBCO path 1601 on substrate 1602 with two opposite step edges 1603 and 1604 fabricated according to method 400 in FIG. 4. Meandering means, throughout this disclosure, that the path forms a series of regular sinuous curves, bends, loops, turns, or windings across trough 1605. In other words, the path swings from side to side as it runs across trough 1605.

Again, Josephson junctions are formed on opposite sides of a trough 1605 in substrate 1062. Due to the meandering path as shown in FIG. 16, the superconducting material forms a path that crosses the two opposing step edges 1603 and 1604 multiple times. In contrast to FIG. 6, where each crossing of a step edge constitutes a single Josephson junction, in FIG. 16 each crossing where the path crosses a step edge constitutes two Josephson junctions in parallel.

For example, a step-edge crossing is indicated at 1606. This example crossing 1606 comprises a first junction 1607 and a second junction 1608, which are connected in parallel and together form a SQUID loop. A connection 1609 at the bottom of trough 1605 connects the SQUID loop at crossing 1606 to a further SQUID loop at the opposite step edge 1604.

At the same time, a further connection 1610 at the top layer connects the SQUID loop at crossing 1606 to a further SQUID loop on the same step edge 1603. This patterns continues in a meandering or zigzag form to create a number of SQUID loops that are connected in series. FIG. 16 also shows pads 1611 and 1612 to connect to the series connected SQUID loops.

As described above, the device 1605 can be constructed from multiple instances or copies of basic building blocks as indicated at 1613. In this example, building block 1613 comprises four loops in series and the device 1600 includes 2.5 building blocks.

With the method disclosed herein, it may be possible to fabricate a higher density of SQUID loops on a single chip, as there will no longer be space used by the presence of a smooth return path or side walls. This may help with scaling up the number of the SQUID loops on a single substrate and make the process more appealing to manufacturers. In the example of FIG. 16 there are ten SQUID loops in a relatively small area demonstrating the scalability of the proposed method.

In some cases the performance is directly linked to the number of loops in an array. Therefore this technique also has the potential to improve device performance. This process may also improve the on-chip uniformity of loops, and thus improve reliability of junctions across a substrate.

Figure 17:
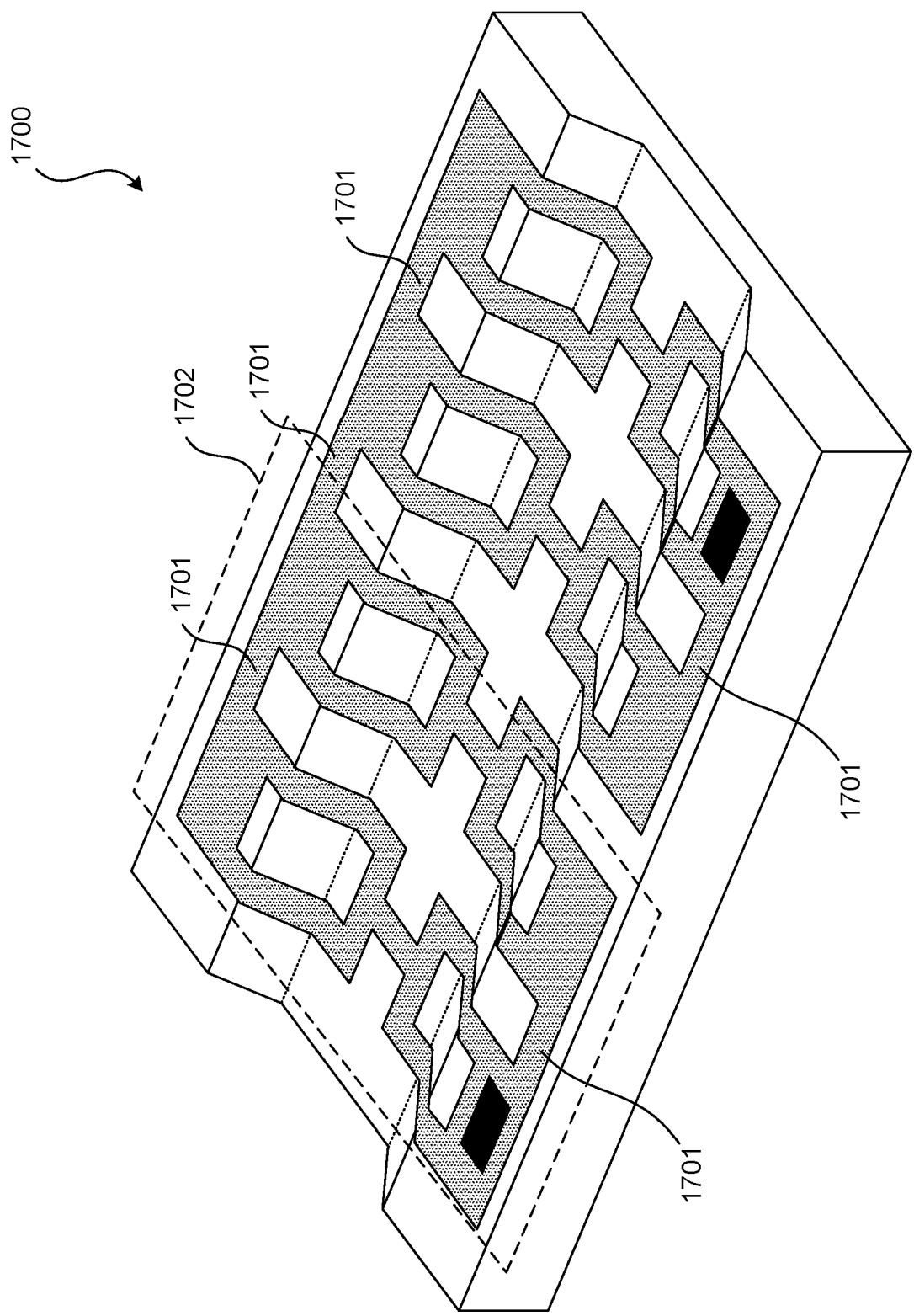
FIG. 17 illustrates an example device with a meandering superconducting path and a SQUID loop comprising two Josephson junctions at each crossing of the path over one of the two opposing steps.

FIG. 17 illustrates yet another example, where the top level connections 1701 are modified compared to FIG. 16, so as to connect two loops in parallel and then connect the parallel connected loops in series. As can be seen, the parallel-connected loops are adjacent to each other on the same step edge. In some examples, the adjacent loops may also be connected at the bottom level within the trough. Many different combinations are possible with potentially a large number of parallel connected loops. Again, a building block is indicated at 1702 where block 1702 now comprises two parallel connected arms with two series connected loops in each arm noting that each block may comprise a larger number of parallel connected arms, such as 10 parallel connected arms with 20 loops in total. These larger blocks are then series connected in the meander shape as described herein.

Figure 18:
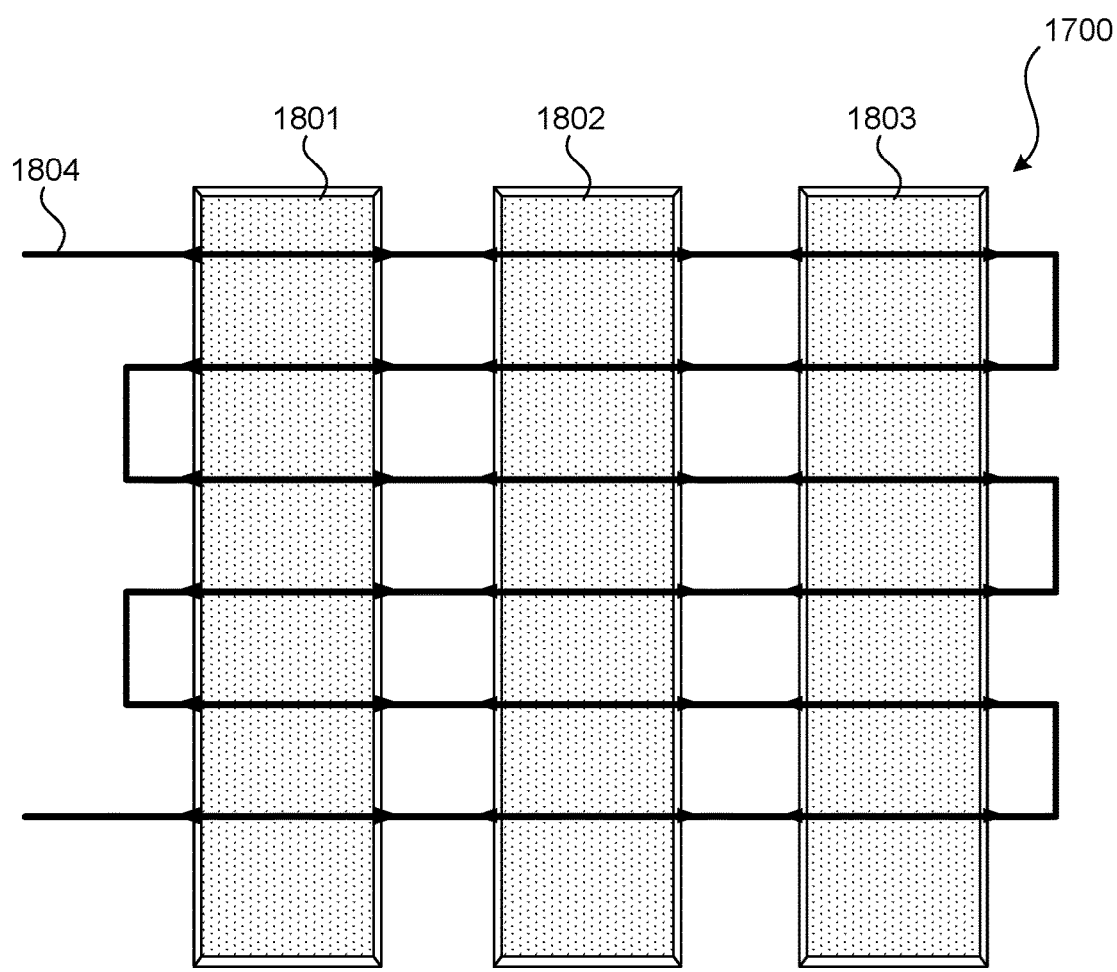

FIG. 18 illustrates yet another example, where there are multiple areas that are exposed in the photo resist to create three trenches (i.e. depressions) 1801, 1802 and 1803. The three trenches 1801, 1802 and 1803 form six step edges in total (two on either side of each trench). A meandering path 1804 of superconducting material crosses the trenches 1801, 1802 and 1803 multiple times before it returns. Each time path 1804 crosses a step edge, a Josephson junction is formed. In FIG. 18, the junctions are indicated as arrows where the direction points upwardly from the bottom of the trench to the top layer. As can be seen, the path 1804 in FIG. 18 forms 36 junctions in total, with a block consisting of 12 junctions. Accordingly, there can be multiple areas that are exposed in the photo resist to create more than one trench, with each trench, having a meandering path consisting of two Josephson junctions and a block consisting of an even number of Josephson junctions.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A method of forming multiple step edges in a surface of a crystalline substrate, the method comprising:
   forming a layer of resist over the surface, the layer of resist comprising openings to expose a selected area of the surface, thereby forming a first wall and a second wall in the layer of resist on a perimeter of the selected area; and
   exposing the resist and the substrate to an ion beam, thereby etching the resist and the exposed areas of the surface to thereby create an upper level outside the selected area and a lower level within the selected area of the surface;
   while exposing the resist and the substrate to the ion beam, gradually rotating the substrate about an axis normal to the surface to thereby form a first step edge at the first wall and a second step edge at the second wall; and
   depositing superconducting material onto the substrate in a meandering shape to form a path that crosses the first and second step edges multiple times,
   to form multiple Josephson junctions comprising at least one Josephson junction each time the path crosses one of the first and second step edges,
   wherein the path comprises multiple connections on the lower level, each connection connecting one of the multiple Josephson junctions on the first step edge to one of the multiple Josephson junction on the second step edge to thereby form the meandering shape.

2. The method of claim 1, wherein at least four junctions are formed and the four junctions are connected in series by the path.

3. The method of claim 2, wherein at least eight junctions are formed.

4. The method of claim 1, wherein the two walls are substantially parallel and opposing each other.

5. The method of claim 1, wherein each of the multiple step edges defines an upper level and a lower level and the superconducting material is deposited to form
   a first path section that crosses one of the two step edges from the upper level to the lower level;
   a second path section that crosses the same one of the two step edges from the lower level to the upper level; and
   a first connection on the lower level that connects the first path section to the second path section without reaching the upper level.

6. The method of claim 5, wherein the first connection is parallel to the one of the two step edges.

7. The method of claim 5, wherein the first path section, the second path section and the first connection form a first loop and material is deposited to form a second connection to connect the first loop to a second loop deposited on a different one of the two step edges.

8. The method of claim 1, wherein the superconducting material is deposited onto the substrate to form a loop comprising two Josephson junctions each time the path crosses one of the two step edges.

9. The method of claim 1, wherein the superconducting material is deposited onto the substrate to form an array comprising more than two Josephson junctions each time the path crosses one of the two step edges.

10. The method of claim 1, wherein gradually rotating the substrate comprises continuously rotating the substrate.

11. The method of claim 10, wherein continuously rotating the substrate comprises rotating the substrate at a constant rotation rate.

12. The method of claim 11, wherein the rotation rate is greater than one rotation during exposing the resist and the substrate to the ion beam.

13. The method of claim 12, wherein the rotation rate is more than 1 rotation per minute.

14. The method of claim 13, wherein the rotation rate is more than 10 rotations per minute.

15. The method of claim 1, wherein the two walls are opposing each other on either side of the exposed area and a distance between the two opposing walls is less than 20 μm.

16. The method of claim 1, wherein junction parameters of the Josephson junctions are identical within manufacturing variations.

17. The method of claim 1, wherein the selected area comprises multiple shapes each having two walls forming two respective step edges and the path crosses the two step edges of each shape multiple times.

18. The method of claim 17, wherein the shapes are rectangular and arranged side by side such that the path crosses the two walls of all of the shapes in a straight line.

19. A device comprising:
   a first wall and a second wall in a surface of a crystalline substrate on a perimeter of an etched area;
   a first step edge at the first wall and a second step edge at the second wall;
   a meandering path of superconducting material deposited onto the substrate, the path crossing the first and second step edges multiple times; and
   multiple Josephson junctions comprising at least one Josephson junction formed within the path each time the path crosses one of the first and second step edges;
   wherein the path comprises multiple connections on the lower level, each connection connecting one of the multiple Josephson junctions on the first step edge to one of the multiple Josephson junction on the second step edge to thereby form the meandering shape.

20. The device of claim 19, wherein the device comprises at least four Josephson junctions connected in series formed within the path.

21. The device of claim 20, wherein the device comprises at least eight Josephson junctions.

22. The device of claim 19, wherein a distance between the two step edges is less than 20 μm.

* * * * *